(12) United States Patent
Chiang et al.

(10) Patent No.: US 6,458,255 B2
(45) Date of Patent: Oct. 1, 2002

(54) ULTRA-LOW RESISTIVITY TANTALUM FILMS AND METHODS FOR THEIR DEPOSITION

(75) Inventors: Tony Chiang, Mountain View; Peijun Ding, San Jose; Barry Chin, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/770,934

(22) Filed: Jan. 25, 2001

Related U.S. Application Data

(63) Continuation of application No. 09/160,638, filed on Sep. 24, 1998, now abandoned.

(51) Int. Cl.$^7$ ............................................... C23C 14/34
(52) U.S. Cl. ............................... 204/192.5; 204/192.22
(58) Field of Search ...................... 204/192.12, 192.13, 204/192.15, 192.17, 192.22

(56) References Cited

U.S. PATENT DOCUMENTS 3,607,384 A    9/1971   Banks ........................ 117/215

(List continued on next page.)

FOREIGN PATENT DOCUMENTS

| EP | 0346828 | 12/1989 | ............. G03F/1/00 |
|----|---------|---------|------------------------|
| EP | 0407133 | 1/1991  | ......... H01L/23/532 |
| EP | 0644535 | 3/1995  | ............. G11B/5/60 |
| EP | 0717436 | 6/1996  | ........ H01L/21/285 |
| EP | 0818556 | 1/1998  | ............ C23C/14/34 |
| JP | 58-056 361 A * | 4/1983 | ............ 204/192.15 |
| WO | WO 97/04143 | 2/1997 | ............ C23C/16/30 |

OTHER PUBLICATIONS

P. Catania et al.,Referenced in patent application. Cited on International Search Report in PCT application corresponding to related U.S. application Ser. No. 08/863,451 and/or 08/924,487 and/or 09/160,638. "Low resistivity body–centered cubic tantalum thin films as diffusion barriers between copper and silicon", *J. Vac. Sci. Technol. A*, vol. 10, No. 5, pp. 3318–3321 (Sep./Oct. 1992).

(List continued on next page.)

*Primary Examiner*—Patrick Ryan
*Assistant Examiner*—Gregg Cantelmo
(74) *Attorney, Agent, or Firm*—Shirley L. Church; Kathi Bean

(57) ABSTRACT

We have discovered that, by depositing a tantalum layer upon a substrate at a temperature of at least 325° C., it is possible to obtain an ultra low resistivity which is lower than that previously published in the literature. In addition, it is possible deposit a $Ta_xN_y$ film having an ultra low resistivity by depositing the $Ta_xN_y$ film upon a substrate at a temperature of at least 275° C., wherein x is 1 and y ranges from about 0.05 to about 0.18. These films having an ultra low resistivity are obtained at temperatures far below the previously published temperatures for obtaining higher resistivity films. A combination of elevated substrate temperature and ion bombardment of the film surface during deposition enables the use of lower substrate temperatures while maintaining optimum film properties. In another development, we have discovered that the ultra low resistivity tantalum and $Ta_xN_y$ films produced by the method of the present invention also exhibit particularly low residual stress, so that they are more stable and less likely to delaminate from adjacent layers in a multilayered semiconductor structure. Further, these films can be chemical mechanical polished at significantly higher rates (at least 40% higher rates) than the higher resistivity tantalum and $Ta_xN_y$ films previously known in the industry. This is particularly useful in damascene processes when copper is used as the interconnect metal, since it reduces the possibility of copper dishing during a polishing step.

4 Claims, 3 Drawing Sheets

U.S. PATENT DOCUMENTS

| | | | |
|---|---|---|---|
| 3,819,976 A | 6/1974 | Chilton et al. | 315/3.5 |
| 3,878,079 A | 4/1975 | Schauer | 204/192 |
| 4,000,055 A | 12/1976 | Kumagi | 204/192 |
| 4,364,099 A | 12/1982 | Koyama et al. | 361/305 |
| 4,683,043 A | 7/1987 | Melton et al. | 204/192.15 |
| 5,175,115 A * | 12/1992 | Abe et al. | 428/5 |
| 5,186,718 A | 2/1993 | Tepman et al. | 29/25.01 |
| 5,221,449 A | 6/1993 | Colgan et al. | 204/192.15 |
| 5,236,868 A | 8/1993 | Nulman | 437/190 |
| 5,281,485 A | 1/1994 | Colgan et al. | 204/192.15 |
| 5,320,728 A | 6/1994 | Tepman | 204/192.12 |
| 5,330,628 A | 7/1994 | Demaray et al. | 204/192.12 |
| 5,464,711 A | 11/1995 | Mogab et al. | 430/5 |
| 5,478,455 A | 12/1995 | Actor et al. | 204/192.13 |
| 5,491,505 A | 2/1996 | Suzuki et al. | 347/203 |
| 5,643,834 A | 7/1997 | Harada et al. | 437/701 |
| 5,882,399 A | 3/1999 | Ngan et al. | 117/89 |
| 6,139,699 A | 10/2000 | Chiang et al. | 204/192.15 |

OTHER PUBLICATIONS

J.–C. Chuang et al. Cited on International Search Report in PCT application corresponding to related U.S. application Ser. No. 08/863,451 and/or 08/924,487 and/or 09/160,638, "Properties of thin Ta–N films reactively sputtered on Cu/SiO$_2$/Si substrates", Thin Solid Films, 322 (1988) pp. 213–217.

L. G. Feinstein et al. Referenced in patent application, "Factors Controlling the Structure of Sputtered Tantalum Films", Thin Solid Films, vol. 16, pp. 129–145 (1973).

T. Koikeda et al. Cited on International Search Report in PCT application corresponding to related U.S. application Ser. No. 08/863,451 and/or 08/924,487 and/or 09/160,638, "Temperature Coefficient of Tantalum Nitride Film Resistors,", Electronics and Communications in Japan, vol. 53–c, No. 12, (1970), pp. 136–142.

N. Kumar et al. Cited on International Search Report in PCT application corresponding to related U.S. application Ser. No. 08/863,451 and/or 08/924,487 and/or 09/160,638, "Growth and properties of radio frequency reactively sputtered titanium nitride thin films", J. Vac. Sci. Technol. A, vol. 5, No. 4, pp. 1778–1782 (Jul./Aug. 1987).

K. Min et al. Referenced in patent application, "Comparative study of tantalum and tantalum nitrides (Ta$_2$N and TaN) as a diffusion barrier for Cu metallization", J. Vac. Sci. Technol. B, No. 14, vol. 5, pp. 129–145 (Sep./Oct. 1996).

L.J. Parfitt et al. Cited on International Search Report in PCT application corresponding to related U.S. application Ser. No. 08/863,451 and/or 08/924,487 and/or 09/160,638, "Origins of residual Stress in Mo and Ta Films: The Role of Impurities, Microstructural Evolution and Phase Transformations", Mat. Res. Soc. Symp. Proc., vol. 436, pp. 505–510 (1997).

R. Pinto et al. Cited on International Search Report in PCT application corresponding to related U.S. application Ser. No. 08/863,451 and/or 08/924,487 and/or 09/160,638, "Getter–Bias Sputtering of High Purity Metal Films in a High Current Vacuum Discharge in the 10$^{-4}$ Torr Range," Japanese Journal of Applied Physics, vol. 9, No. 2, (Feb. 1970).

S.M. Rossnagel and J. Hopewood, Referenced in patent application, Provided by Examiner in prosecution of related application, U.S. Ser. No. 08/863,451 filed May 27, 1997 and/or U.S. Ser. No. 09/160,638, "Metal ion deposition from ionized magnetron sputtering discharge", J. Vac. Sci Technol. B, vol. 12, No. 1, pp. 449–453, (1994).

S.M. Rossnagel et al. Referenced in patent application, Provided by Examiner in Prosecution of related application, U.S. Ser. No. 08/863,451 filed May 27, 1997 and/or U.S. Ser. No. 09/160,638, "Thin high atomic weight refractory film deposition for diffusion barrier, adhesion layer, and seed layer applications", J. vac. Sci. technol. B, vol. 14, No. 3, pp. 1819–1827 (May/Jun. 1996).

T. Shioyama cited on International Search Report in PCT application corresponding to related U.S. application Ser. No. 08/863,451 and/or 08/924,487 and/or 09/160,638, "Stability improvement of TaN thin films used as resistive thermoconductive vacuum gauges", J. Vac Sci. Technol. A, vol. 3, No. 4, pp. 1871–1873, (Jul./Aug. 1985).

C. Steinbruchel Referenced in patent application, Provided by Examiner in prosecution of related application, U.S. Ser. No. 08/863,451 filed May 27, 1997 and/or U.S. Ser. No. 09/160,638, "Patterning of Copper for Multilevel Metallization: Reactive Ion Etching and Chemical–Mechanical Polishing," Applied Surface Science, 91, pp. 139–146 (1995).

Referenced in patent application "Handbook of Thin Film Technology" McGraw–Hill, p. 18–12 (1970).

Cited on International Search Report in PCT application corresponding to related to U.S. application Ser. No. 08/863, 451 and/or 08/924,487 and/or 09/160,638 "Method for Controlling the Crystalline Phase of Tantalum", IBM Technical Disclosure Bulletin, vol. 32, No. 5A, Oct. 1989, pp. 42–43.

Provided by applicant in prosecution of parent application, U.S. Ser. No. 09/160,638. U.S. patent application Ser. No. 08/978,792, of Chiang et al., filed Nov. 26, 1997.

Provided by applicant in prosecution of parent application, U.S. Ser. No. 09/160,638. U.S. patent application ser. No. 08/995,108, of Ding et al., filed Dec. 19, 1997.

* cited by examiner

ULTRA-LOW RESISTIVITY TANTALUM FILMS AND METHODS FOR THEIR DEPOSITION

This application is a continuation of U.S. application Ser. No. 09/160,638 filed Sep. 24, 1998, now abandoned.

BACKGROUND OF THE INVENTION

1. Field of the Invention

The present invention pertains to tantalum films having ultra-low resistivity, in the range of about 10 $\mu\Omega$-cm, as well as methods for depositing ultra-low resistivity tantalum films. Tantalum films deposited according to the method of the invention can be removed from a semiconductor substrate surface using chemical mechanical polishing (CMP) techniques far more rapidly than previously known tantalum films.

2. Brief Description of the Background Art

As microelectronics continue to miniaturize, interconnection performance, reliability, and power consumption has become increasingly important, and interest has grown in replacing aluminum alloys with lower resistivity and higher reliability metals. Copper offers a significant improvement over aluminum as a contact and interconnect material. For example, the resistivity of copper is about 1.67 $\mu\Omega$-cm, which is only about half of the resistivity of aluminum.

One of the preferred technologies which enables the use of copper interconnects is the damascene process. This process for producing a multi-level structure having feature sizes in the range of 0.5 micron ($\mu$m) or less typically includes the following steps: blanket deposition of a dielectric material over a substrate; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139–146.

The preferred barrier layer/wetting layer for use with copper comprises a tantalum nitride—tantalum barrier/wetting layer having a decreasing nitrogen content toward the upper surface of the layer. This structure, which provides excellent barrier properties while increasing the <111> content of an overlying copper layer, provides a copper layer having improved electromigration resistance, as described in applicants' copending application Ser. No. 08/995,108. A barrier layer having a surface which is essentially pure tantalum or tantalum including only a small amount of nitrogen (typically less than about 15 atomic percent) performs well as a barrier layer and also as a wetting layer to enhance the subsequent application of an overlying copper layer.

Philip Catania et al. in "Low resistivity body-centered cubic tantalum thin films as diffusion barriers between copper and silicon", J. Vac. Sci. Technol. A 10(5), September/October 1992, describes the resistivity of thin bcc-tantalum films and β-tantalum films. The resistivity for bcc-tantalum (α-tantalum) films is said to be on the order of 30 $\mu\Omega$-cm, while the resistivity of the β-tantalum films ranges from about 160–180 $\mu\Omega$-cm. A comparison of the effectiveness of thin bcc-Ta and β-Ta layers as diffusion barrier to copper penetration into silicon shows that the bcc-Ta which exhibits low resistivity also performs well as a barrier layer up to 650° C.

Kyung-Hoon Min et al. in "Comparative study of tantalum and tantalum nitrides ($Ta_2N$ and TaN) as a diffusion barrier for Cu metallization", J. Vac. Sci. Technol. B 14(5), September/October 1996, discuss tantalum and tantalum nitride films of about 50 nm thickness deposited by reactive sputtering onto a silicon substrate. The performance of these films as a diffusion barrier between copper and silicon is also discussed. The diffusion barrier layer performance is said to be enhanced as nitrogen concentration in the film is increased.

U.S. Pat. No. 3,607,384 to Frank D. Banks, issued Sep. 21, 1971, describes thin film resistors which utilize layers of tantalum or tantalum nitride. FIG. 1 in the '385 patent shows the resistivity for a particular tantalum nitride film as a function of the sputtering voltage and FIG. 2 shows the resistivity as a function of the nitrogen content of the film. The lowest resistivity obtained under any conditions was about 179 $\mu\Omega$-cm.

U.S. Pat. No. 3,819,976 to Chilton et al., issued Jun. 25, 1974, describes a tantalum-aluminum alloy attenuator for traveling wave tubes. In the background art section of this patent, there is a reference to tantalum film undergoing a phase transition from beta-tantalum to body-centered-cubic (alpha) tantalum at about 700° C.

U.S. Pat. No. 3,878,079 to Alois Schauer, issued Apr. 15, 1975, describes and claims a method of producing thin tantalum films which are body-centered cubic lattices. The films are deposited upon a glass substrate, and FIG. 2 of the '079 patent shows resistivity for tantalum nitride films as a function of nitrogen content. U.S. Pat. No. 4,000,055 to Kumagai et al., issued Dec. 28, 1976, discloses a method of depositing nitrogen-doped beta-tantalum thin films. FIG. 2 of the '055 patent also shows the resistivity of the film as a function of the nitrogen content of the film.

U.S. Pat. No. 4,364,099 to Koyama et al., issued Dec. 14, 1982, discloses a tantalum film capacitor having an α-tantalum as a lower electrode, a chemical conversion layer of α-tantalum as a dielectric, and an upper electrode. This references also discusses a phase transition of the tantalum film depending on the nitrogen concentration of the film. When the nitrogen content ranges from about 6 to about 12 percent, the resistivity of the tantalum thin film is said to be advantageously low, although no particular resistivity data is provided.

U.S. Pat. No. 5,221,449 to Colgan et al., issued Jun. 22, 1993, describes a method of making alpha-tantalum thin films. In particular, a seed layer of Ta(N) is grown upon a substrate by reactive sputtering of tantalum in a nitrogen-containing environment. A thin film of α-tantalum is then formed over the Ta(N) seed layer. In the Background Art section of the patent, reference is made to the "Handbook of Thin Film Technology", McGraw-Hill, page 18–12 (1970), where it is reported that if the substrate temperature exceeds 600° C., alpha phase tantalum film is formed. Further reference is made to an article by G. Feinstein and R. D. Huttemann, "Factors Controlling the Structure of Sputtered Tantalum Films", *Thin Solid Films,* Vol. 16, pages 129–145 (1973). The authors are said to divide substrates into three groups: Group I, containing substrates onto which only beta-tantalum can be formed (including glass, quartz, sapphire, and metals such as copper and nickel); Group II, containing substrates onto which only alpha (bcc) tantalum can be grown (including substrates coated with 5000 Å thick metal films such as gold, platinum, or tungsten); and Group III, containing substrates which normally produce alpha-tantalum, but which can be induced to yield beta-tantalum or mixtures of alpha and beta by suitable treatment of the surface (i.e., substrates coated with 5,000 Å of molybdenum, silicon nitride, or stoichiometric tantalum nitride, $Ta_2N$).

As the feature size of semiconductor devices becomes ever smaller, the barrier/wetting layer becomes a larger portion of the interconnect structure. In order to maximize the benefit of copper's low resistivity, the diffusion barrier/adhesion layer must be made very thin and/or must have low resistivity itself (so that it does not impact the effective line resistance of the resulting metal interconnect structure). As is readily apparent, depending on the device to be fabricated, various methods have been used in an attempt to develop a tantalum film which is a phase when lower resistivity is desired. Typically, small additions of nitrogen have been made to tantalum films to lower the resistivity of the tantalum. This method is difficult to control, as any deviation in the nitrogen content (even±1 sccm of nitrogen flow) may lead to a significant increase in resistivity. Another proposed sputter deposition method for lowering resistivity involves control of the ion energy striking the substrate (via grounding of the substrate). However, this method does not always produce reproducible results, is sensitive to substrate cleaning and preparation, and affects the film stress. Care must be taken to avoid high film stress so that the barrier/wetting layer does not tend to separate or pop off the substrate upon which it is deposited.

After deposition of the tantalum-comprising barrier/wetting layer, any of the tantalum-comprising material deposited on the substrate in areas other than the conductive interconnect structures must be removed. Whether the tantalum-comprising material is removed by ion bombardment techniques (e.g., reactive ion etching) or by CMP, the difference in hardness between the tantalum-comprising material and copper causes problems. Residual material from the copper deposition is rapidly removed, leaving residual material from the tantalum-comprising barrier layer. Continued ion bombardment or CMP to remove the tantalum-comprising material can result in the undesired removal of adjacent copper which is intended to make up the interconnect structure.

It would be highly desirable to have an ultra-low resistivity tantalum film which exhibits low stress (tends to stay bonded to underlying layers), and which is more easily polished using CMP, so that its polishing rate is closer to that of copper.

SUMMARY OF THE INVENTION

We have discovered that, by depositing a tantalum layer at particular substrate temperatures, it is possible to obtain a lower resistivity than has previously been known in the literature. The low resistivity material has been obtained by sputter deposition at an elevated substrate temperature ranging from about 325° C. to about 550° C., or by sputter deposition at a substrate temperature of less than about 325° C. followed by annealing at a temperature of about 325° C. or greater. High density plasma sputtering techniques which provide for ion bombardment of the film surface can be used in combination with the elevated substrate temperature, to add momentum energy to the film surface, thereby reducing the substrate temperature required, while still providing the ultra-low resistivity tantalum film. A reduction of about 40% in the required substrate temperature can be obtained by this means, while maintaining a reasonable film stress and a reasonable film deposition time period.

In a less preferred, alternative method, a small amount (less than about 15 atomic %) of nitrogen may be added to the tantalum film (while depositing the film at an elevated temperature) to obtain the lower resistivity at a slightly lower substrate temperature, in the range of about 275° C. This provides a lower resistivity than previously known for nitrogen addition, while reducing the process temperature necessary to obtain the lower resistivity.

In another development, we have discovered that the tantalum layer produced by the method of the present invention can be more readily removed by the CMP polishing techniques used for removal of excess, residual metal in the damascene process. The low resistivity tantalum is more flexible, more easily cleaved, and more easily polished—an advantage in the damascene process when it is desired to remove excess metal from the field surface of a device structure. This is particularly helpful when copper is used as the interconnect metal, since copper polishes easily and it previously took 4 times longer to remove tantalum barrier layer then to remove excess copper from a field surface. The low resistivity tantalum deposited using the present method exhibits an increase in CMP polishing rate of nearly 50% over the previously known CMP polishing rate for tantalum films.

BRIEF DESCRIPTION OF THE DRAWINGS

FIG. 6 also shows the CMP polishing rate for two $Ta_xN_y$ films which were deposited at a substrate platen heater temperature of about 50° C.

DETAILED DESCRIPTION OF THE PREFERRED EMBODIMENTS

Figure 1:
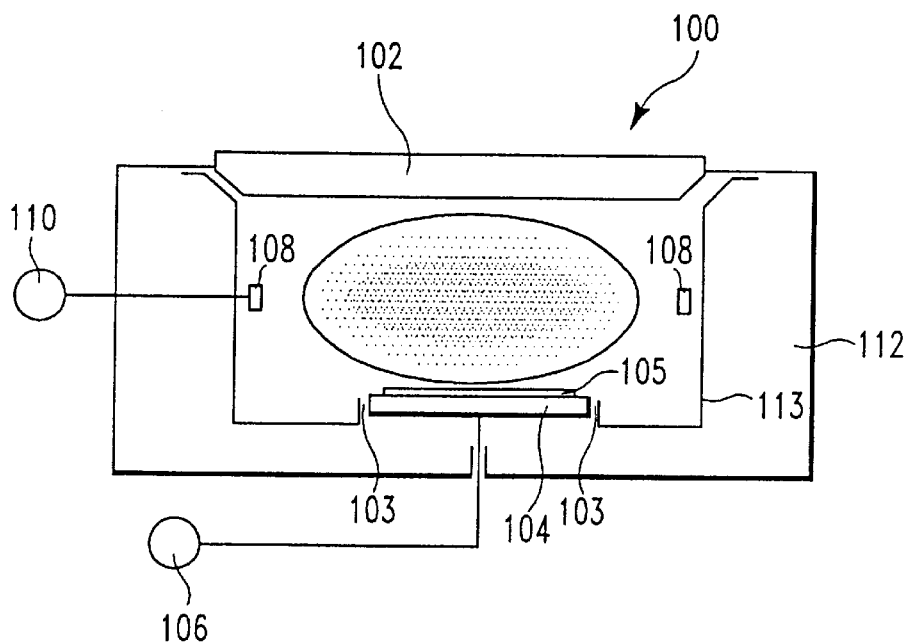
FIG. 1 shows a schematic cross-sectional view of a sputtering chamber of the kind which can be used to deposit the tantalum film of the present invention. This illustration shows the critical elements of a high density plasma (ion-deposition) sputtering chamber (or reactive-ion-deposition sputtering chamber), The critical elements include a sputtering target to with DC power is applied, an RF powered coil for creating and maintaining ionized species within a plasma over the surface of the semiconductor substrate being processed, and a means for application of RF power to the support platen on which the substrate sets, enabling the creation of a bias on the substrate. The combination of the RF powered coil with the RF powered support platen enables the ion bombardment of a film surface as the tantalum film is deposited.

We have discovered a surprising and simple method for depositing ultra-low resistivity (about 10 $\mu\Omega$-cm) tantalum films. These films can be obtained by either sputter deposition upon a substrate which is at an elevated temperature or by a combination of deposition upon a substrate at such elevated temperature with simultaneous ion bombardment of the film surface during deposition.

Tantalum films having a slightly higher resistivity (about 20 $\mu\Omega$-cm) can be obtained by deposition at low temperature (e.g. room temperature), followed by thermal annealing. Deposition at an elevated temperature is preferred for process throughput reasons and because a lower resistivity is obtained.

Deposition of a 1,000 Å thick tantalum film using high density plasma or long-throw sputtering upon a silicon dioxide substrate, at a substrate support platen temperature of about 400° C. or higher (a substrate temperature of about 325° C. or higher) results in a tantalum film resistivity of about 10 $\mu\Omega$-cm. (Deposition of thinner films under the same conditions provides the same low resistivity.) This is compared with a film resistivity of about 165 $\mu\Omega$-cm obtained for a tantalum film sputtered upon a room temperature substrate. In addition, deposition of the tantalum film at room temperature, followed by a 15 minute anneal at a substrate temperature of either 350° C. or 550° C., produces a tantalum film having a resistivity of about 20 $\mu\Omega$-cm.

We have also discovered that by adding a small amount of nitrogen to the sputtering chamber, to produce a $Ta_xN_y$ film where x is 1 and y ranges from about 0.5 to about 0.18, a $Ta_xN_y$ film having a resistivity of about 20 $\mu\Omega$-cm can be obtained at even lower temperatures, particularly at a substrate temperature of about 275° C. or greater.

Although tantalum and tantalum nitride are quickly gaining industry acceptance as the barrier layer of choice for copper metallization, the difference in CMP polishing rate between copper and these materials causes problems in the damascene process for preparation of copper interconnect structures. The softer copper, which polishes more rapidly tends to "dish", i.e. to be removed from an intended deposition area during the polishing period necessary for removal of excess barrier layer materials. We have discovered that the low resistivity $\alpha$ phase tantalum produced by the method of the present invention (described above) shows a CMP rate superior to standard $\beta$ phase tantalum and more similar to that of tantalum nitride. This makes it possible to use tantalum as the barrier layer and to use thicker tantalum barrier layers.

A more detailed description of the ultra-low resistivity tantalum films and methods for their deposition is presented below.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

Specific terminology of particular importance to the description of the present invention is defined below.

The term "aspect ratio" refers to, but is not limited to, the ratio of the height dimension to the width dimension of particular feature. When the feature has more than one width dimension, the aspect ratio is typically calculated using the smallest width dimension of the feature. For example, a contact via opening which typically extends in a tubular form through multiple layers has a height and a diameter, and the aspect ratio would be the height of the tubular divided by the diameter. The aspect ratio of a trench would be the height of the trench divided by the minimal width of the trench, which typically occurs at its base.

The term "collimated sputtering" refers to, but is not limited to, collimated sputtering where a spatial filter or 'collimator', comprising a plurality of transmissive cells, is positioned between the sputtering target and the substrate to prevent sputtered particles from reaching the substrate surface at low angles of incidence. The spatial filter controls the location at which sputtered emissions are deposited upon the substrate surface. This serves to create a more directional flux to the substrate.

The term "copper" includes, but is not limited to alloys of copper of the kind typically used in the semiconductor industry. The preferred embodiments described herein are with reference to a copper alloy comprising about 98% by weight copper, but the invention can be used in combination with other conductive materials which exhibit a substantially smaller copper content. For example, the invention can be used where the metallization layer comprises aluminum-copper alloys, where the copper content is typically less than about 4 weight %, and aluminum-copper-silicon alloys, where the copper content is typically about 0.5 weight %.

The term "decoupled plasma source" refers to a plasma generation apparatus which has separate controls for power input to a plasma source generator and to a substrate bias device. Typically the plasma source controller controls the supply of inductively coupled RF power which determines plasma density (source power) and the bias controller controls the supply of RF power or DC power which is used to generate a DC bias voltage on the semiconductor substrate surface (bias power). The bias voltage affects the ion bombardment energy on the substrate surface. This decoupled plasma source typically incorporates measures to separate (decouple) the influence of the source power and bias power on one another. The ENDURA® metal deposition system and CENTURA® metal etch system available from Applied Materials, Inc. of Santa Clara, Calif. which includes decoupled plasma source power and bias power control are referred to as "DPS" systems. Similar equipment available from other manufacturers may be referred to by different nomenclature.

The term "feature" refers to, but is not limited to, contacts, vias, trenches, and other structures which make up the topography of the substrate surface.

The term "high density plasma sputter deposition" or "ion plasma deposition" or "IMP sputter deposition" refers to, but is not limited to, sputter deposition, preferably magnetron sputter deposition (where a magnet array is placed behind the target), where a high density plasma is created using the application of inductively coupled RF power which is typically applied to a coil which is positioned between the sputtering cathode and the substrate support electrode. This arrangement provides an increased portion of the sputtered emission is in the form of ions at the time it reaches the substrate surface. In high density plasma deposition, the electron density is typically at least $10^{11}$ e$^-$/cm$^3$. A preferred apparatus for high density plasma sputter deposition is the ENDURA® "IMP" metal deposition system.

The term "ion deposited copper" or "IMP deposited copper" refers to a copper deposition which was sputtered using a high density plasma sputter deposition process.

The term "ion deposited Ta or $Ta_xN_y$" or "IMP deposited Ta or $Ta_xN_y$" refers to a Ta or $Ta_xN_y$ deposition which was sputtered using a high density plasma sputter deposition process.

The term "long-throw sputter deposition" refer to a sputter deposition technique which utilizes conventional, non-collimated magnetron sputtering at low pressures, where the distance between the target and the substrate is equal to or greater than the diameter of the substrate. Long-throw (gamma) sputter deposition enables control of the degree of directionality in the deposition of film layers, resulting in improved step coverage as compared with conventional magnetron sputtering.

The term "reactive ion deposition" or "reactive ion metal plasma" refers to ion-deposition sputtering wherein a reactive gas is supplied during the sputtering to react with the ionized material being sputtered, producing an ion-deposition sputtered compound containing the reactive gas element.

The term "SEM" refers to a scanning electron microscope. The term "standard copper deposition" or "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of ionized target material which reaches the substrate is less than 10%, more typically less than 1%, of that sputtered from the target.

The term "tantalum film" refers to a film wherein at least 98 atomic % of the film is tantalum.

The term "$Ta_xN_y$" refers to a material wherein x represents the number of tantalum atoms and y represents the relative number of nitrogen atoms.

II. AN APPARATUS FOR PRACTICING THE INVENTION

A process system in which the method of the present invention may be carried out is the Applied Materials, Inc. (Santa Clara, Calif.) Endura® Integrated Processing System. This process system is not specifically shown in the Figures. However, the system is generally known in the semiconductor processing industry and is shown and described in U.S. Pat. Nos. 5,186,718 and 5,236,868, the disclosures of which are incorporated by reference. The critical elements of a reactive ion metal plasma sputter deposition system are shown in a schematic format in FIG. 1. Process chamber 100 is used for the high density plasma deposition of a barrier layer such as a Ta or a $Ta_xN_y$ layer.

Process chamber 100 is typically a magnetron chamber which employs a standard sputter magnet (not shown) to confine the sputtering plasma, enabling an increased sputtering rate. In addition, the process chamber includes an inductively coupled RF source 110, typically in the form of a single, flat coil 108, positioned between a sputtering cathode (target) 102 and the substrate support electrode 104, whereby a larger portion of the sputtered emission is in the form of ions at the time it reaches the substrate surface. An RF power source 106 is used to apply a bias to substrate support electrode 104, enabling formation of a DC bias on semiconductor substrate 105. Typically a shield 113 surrounds the area in which plasma 107 is created from gases which enter through channels 103. Shield 113 is surrounded by a vacuum chamber 112 which enables the evacuation of gases from the substrate processing area through evacuation channels (not shown). In the preferred embodiment of the present invention where the barrier layer to be formed is $Ta_xN_y$, the tantalum nitride is formed by sputtering a tantalum target using techniques known in the art, where argon is gas used to create sputtering ions, and by adding nitrogen to the process chamber 100 through channels 103. At least a portion of the nitrogen is ionized as it passes by ionization coil 108. The reactive nitrogen is free to react with reactive tantalum to form tantalum nitride which is then attracted toward the surface of semiconductor substrate 105 by the bias placed on that substrate.

III. THE ULTRA-LOW RESISTIVITY TANTALUM FILMS

The tantalum films of the invention have a resistivity of less than 25 $\mu\Omega$-cm; more preferably, less than 20 $\mu\Omega$-cm; most preferably, less than 15 $\mu\Omega$-cm. Resistivities as low as 10 $\mu\Omega$-cm or less have been achieved using the deposition methods of the invention.

Figure 2:
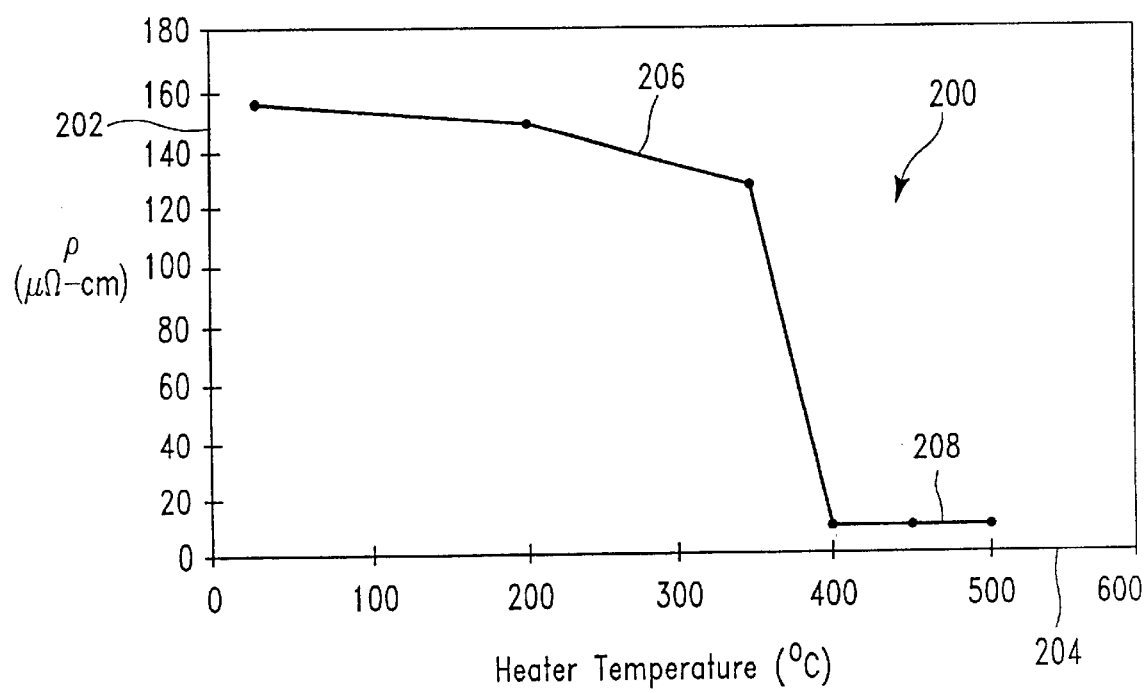
FIG. 2 is a graph showing the resistivity of a sputter-deposited tantalum film (deposited using long-throw or high density plasma techniques) as a function of the substrate platen heater temperature during deposition of the film. The substrate surface temperature is estimated to have been between 50° C. to 75° C. colder than the substrate platen heater temperature illustrated.

Curve 200, FIG. 2, shows the resistivity (on vertical axis 202) of sputter-deposited tantalum films (deposited via collimated, or long-throw, or high density plasma techniques) as a function of the substrate platen heater temperature (on vertical axis 204) during deposition of the film. (The substrate surface temperature is estimated to have been about 50° C. to about 75° C. colder than the substrate platen heater temperature illustrated.) The tantalum films represented by portion 206 of curve 200, where the tantalum resistivity is greater than 100 $\mu\Omega$-cm, were determined to be β-tantalum. The tantalum films represented by portion 208 of curve 200, where the resistivity is less than 25 $\mu\Omega$-cm, were determined to be α-tantalum (body-centered cubic tantalum). The ultra low resistivity films were obtained when the substrate platen heater temperature was about 400° C. (representing a substrate temperature of about 325° C.–350° C.) or higher.

Figure 3:
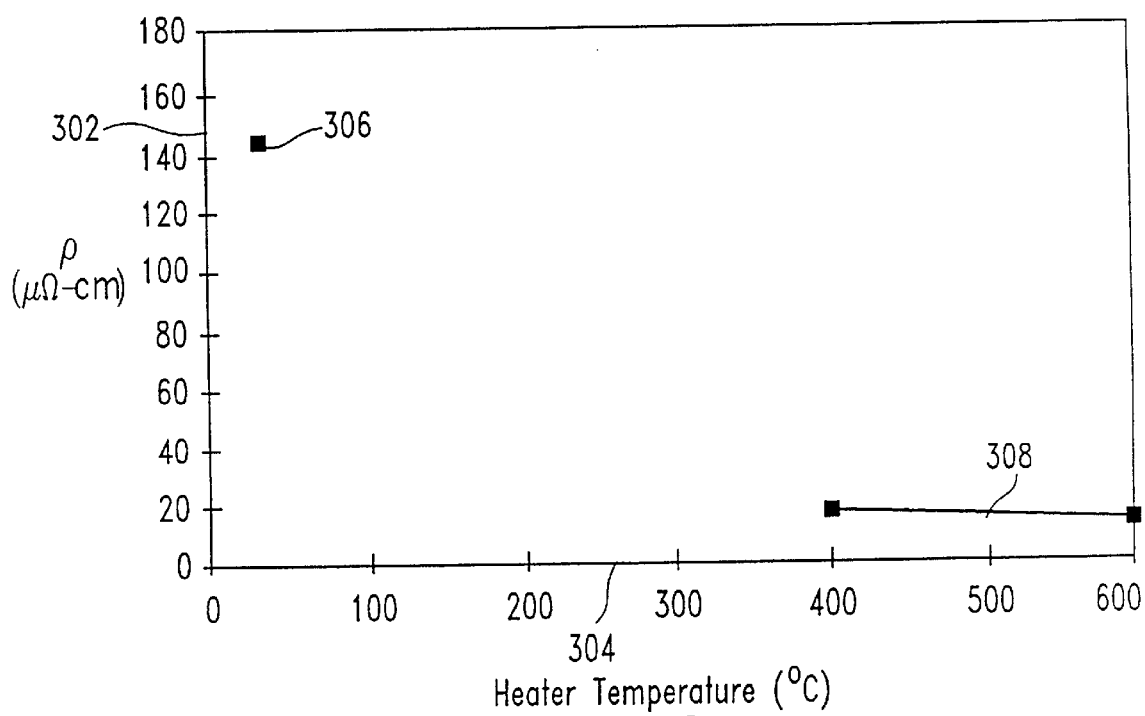
FIG. 3 is a graph showing the resistivity of a sputter-deposited tantalum film (deposited using long-throw or high density plasma techniques), where the tantalum was deposited at room temperature, then annealed for 15 minutes at 400° C. or 600° C.

FIG. 3, at point 306, shows the resistivity of a sputter-deposited tantalum film (deposited via collimated, or long-throw, or high density plasma techniques) deposited at room temperature (about 25° C.). Once again, the resistivity is shown on vertical axis 302 and the substrate platen heater temperature is shown on horizontal axis 304. This sputter deposited tantalum film, when annealed on the substrate support platen for a time period of about 15 minutes at a heater temperature of about 400° C. or higher, exhibits a resistivity of less than about 20 $\mu\Omega$-cm, as illustrated by curve 308.

Figure 4:
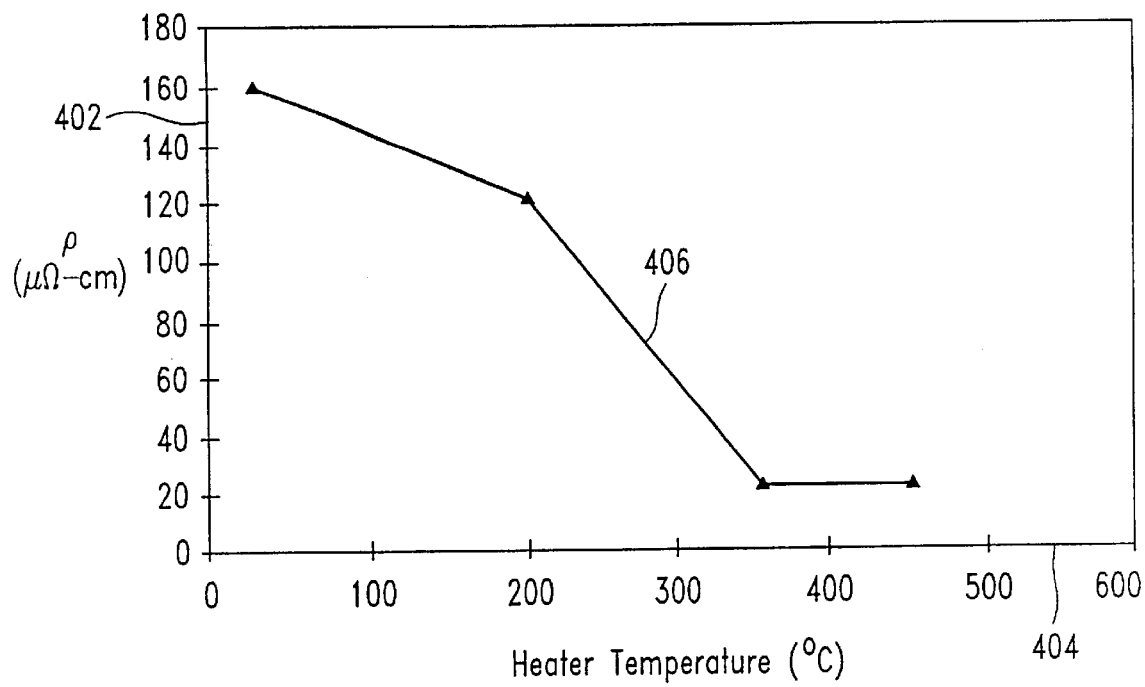
FIG. 4 is a graph showing the resistivity of a sputter-deposited $Ta_xN_y$ film (deposited using long-throw or high density plasma techniques) as a function of the substrate platen heater temperature during deposition of the film, wherein x is 1 and y ranges from about 0.05 to about 0.18.

FIG. 4 shows the resistivity of collimated, or long-throw, or high density plasma deposited films having a $Ta_xN_y$ composition, where x is 1 and y ranges from about 0.05 to about 0.18. The resistivity is shown as a function of the substrate platen heater temperature during sputtering. Once again, the resistivity is shown on vertical axis 402 and the substrate platen heater temperature is shown on horizontal axis 404. The substrate temperature is typically about 50° C. to about 75° C. lower than the substrate platen heater temperature. With the nitrogen present in the sputtered film, it is possible to obtain the ultra low resistivity $Ta_xN_y$ film at even lower deposition temperatures. $Ta_xN_y$ films having a resistivity of about 20 $\mu\Omega$-cm were obtained at substrate heater temperatures of about 340° C. or higher (substrate temperatures of about 275° C. or higher).

Figure 5:
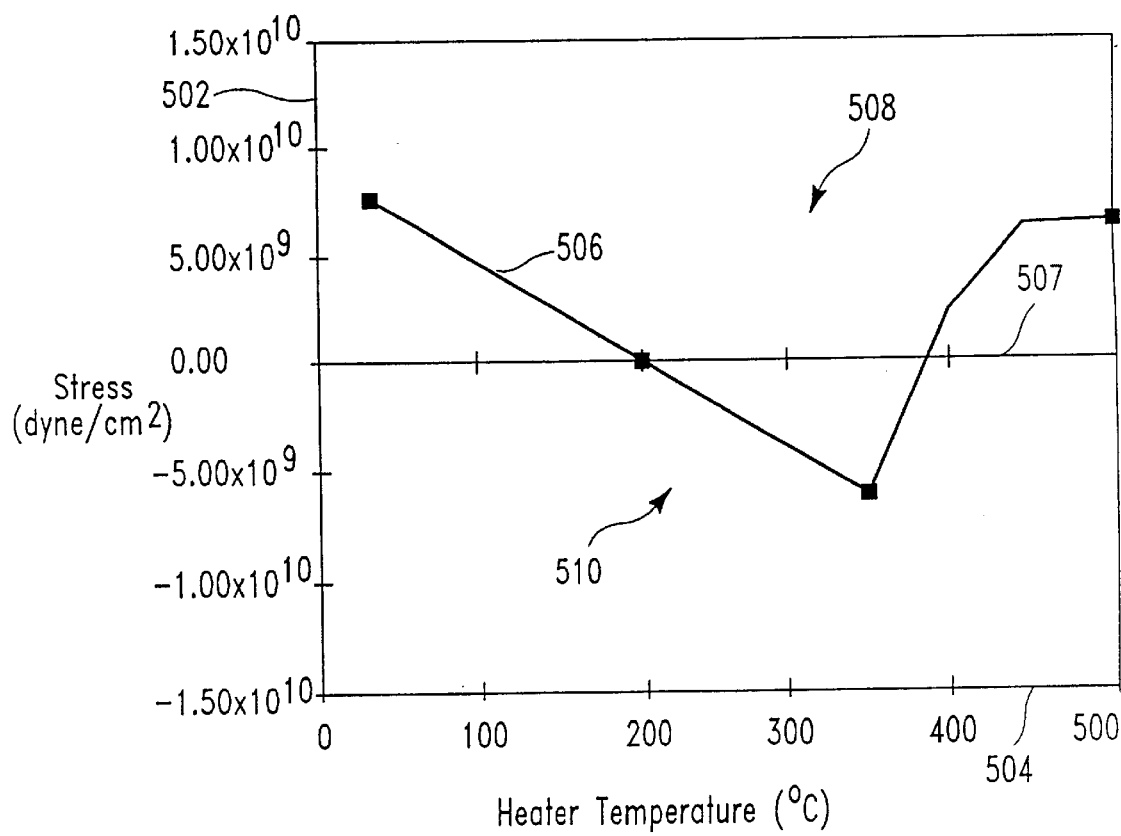
FIG. 5 is a graph showing the stress (in dynes/cm$^2$) of a sputter-deposited tantalum film (deposited using long-throw or high density plasma techniques) as a function of the substrate platen heater temperature during deposition of the film.

The ultra-low resistivity films of the present invention tend to be low stress films as well. FIG. 5 is a graph showing the stress (in dynes/cm$^2$ on vertical axis 502) of a sputter-deposited tantalum film as a function of the substrate platen heater temperature (in °C. on horizontal axis 504) during deposition of the film. As can be seen from the graph in FIG. 5, tantalum films deposited at heater temperatures within the range of about 365° C. to about 500° C. had low tensile stresses ranging from about $-2.5 \times 10^9$ to about $5 \times 10^9$ dynes/cm$^2$. The negative stress values, represented by area 510 under line 507 represent tantalum films in compression. The positive stress values, represented by area 508 over line 507 represent tantalum films in tension. By maintaining the heater temperature at about 365° C. or higher during deposition of the film, the stability of the deposited film and its adhesion to adjacent substrates is improved.

Figure 6:
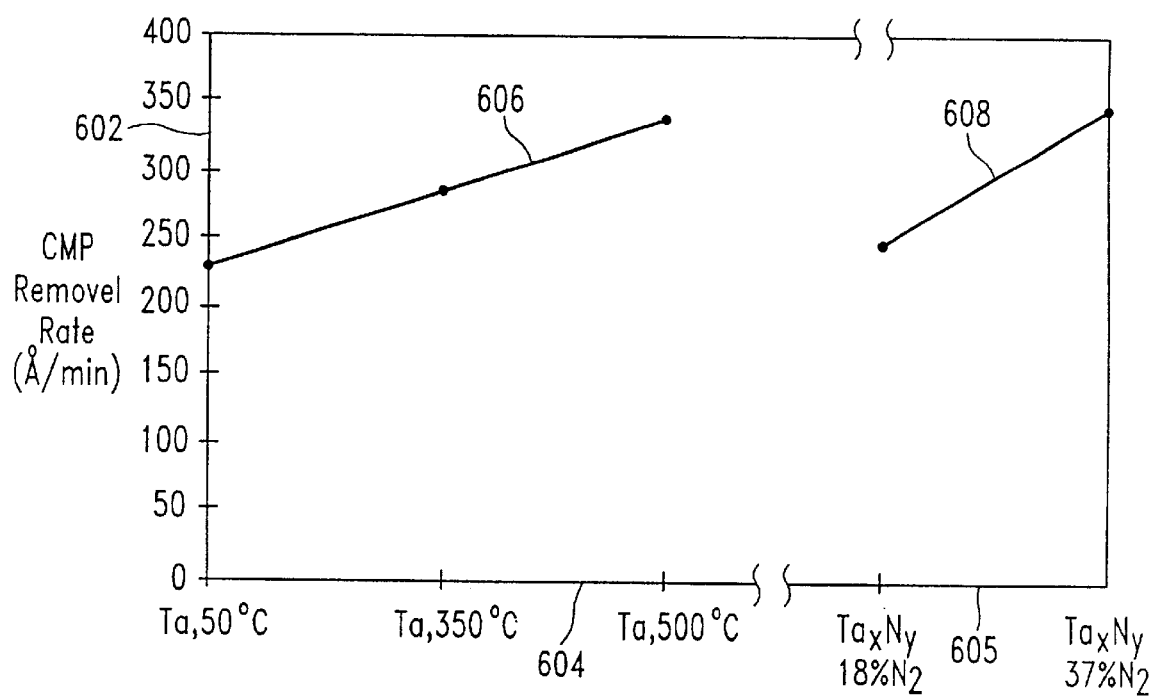
FIG. 6 is a graph showing the chemical-mechanical polishing (CMP) removal rate (in Å/min) of a sputter-deposited tantalum film (deposited using long throw or high density plasma techniques) as a function of the substrate platen heater temperature.

Unexpectedly, we discovered that the tantalum films of the present invention can be polished more rapidly using CMP techniques and are more flexible when cleaved than the prior art tantalum films. FIG. 6 shows the chemical-mechanical polishing (CMP) removal rate (in Å/min on vertical axis 602) of a sputter-deposited tantalum film 606 (deposited via collimated, or long-throw, or high density plasma techniques, with or without nitrogen) as a function of the substrate platen heater temperature (in ° C. on horizontal axis 604). FIG. 6 also shows the CMP removal rate of $Ta_xN_y$ 608 (in Å/min on vertical axis 602) as a function of nitrogen content (in atomic % of the film on horizontal axis 605), when deposited at a heater temperature of about 50° C. Tantalum films deposited at a heater temperature of 50° C. had a CMP removal rate of about 230 Å per minute; Ta films deposited at a heater temperature of 350° C. had a CMP removal rate of about 280 Å per minute; and, Ta films deposited at a heater temperature of 500° C. had a CMP removal rate of about 340 Å per minute. Extrapolating from graph 606 in FIG. 6, tantalum films deposited at a heater temperature within the range of about 375° C. to about 500° C. (representing a substrate temperature within the range of about 300–450° C.) would have a CMP removal rate in the range of about 300 to about 340 Å per minute, which is significantly better than the CMP removal rate of 230 Å per minute obtained for Ta films deposited at a heater temperature of 50° C.

Referring to graph 608 in FIG. 6, tantalum films containing about 18 atomic percent nitrogen had a CMP removal rate of about 250 Å per minute. Tantalum films containing about 37 atomic percent nitrogen had a CMP removal rate of about 350 Å per minute. However, these films do not offer the low resistivity of the Ta films of the present invention.

The ultra-low resistivity tantalum films of the invention are particularly suited for use as barrier/adhesion layers for use in copper metallization, in high stability conductive films for integrated circuit devices (e.g., gate material to DRAMs, etc.), in thin film resistors, and in ink jet heads, by way of example and not by way of limitation.

IV. METHODS FOR DEPOSITING THE ULTRA-LOW RESISTIVITY TANTALUM FILMS

A preferred embodiment method of the invention comprises sputter depositing a tantalum film on a substrate at a substrate temperature of about 325° C. or greater; preferably, at a substrate temperature within the range of about 350° C. to about 450° C.

In a second preferred embodiment method, in addition to sputter depositing a tantalum film on a substrate at an elevated temperature, the surface of the film is ion bombarded during deposition to transfer momentum energy to the film surface. This permits deposition of the film at a temperature which is about 40% lower than when ion bombardment is not used.

In a first, less preferred alternative method, the tantalum film is sputter deposited at room temperature (about 25° C.), and the film is subsequently annealed at a temperature ranging from about 325° C. to about 550° C. for a time period of about 1 minute to about 15 minutes (longer periods will also work).

In a second, less preferred alternative method, a $Ta_xN_y$ film is sputter deposited on a substrate at an elevated temperature, where x is 1 and y ranges from about 0.05 to about 0.18 (nitrogen is present in the sputtering chamber in an amount which produces a $Ta_xN_y$ film containing between about 5 and about 15 atomic percent nitrogen). The elevated substrate temperature is about 275° C. or greater; preferably, at a substrate temperature within the range of about 300° C. to about 400° C. It is expected that ion bombardment of the $Ta_xN_y$ film surface during sputter deposition would permit deposition of the film at a temperature which is about 40% lower, as described with respect to tantalum.

In a third, less preferred alternative method, a $Ta_xN_y$ film was sputter deposited on the substrate at approximately room temperature (i.e., at a substrate temperature within the range of about 15° C. to about 50° C.), and then annealed by heating the film (and substrate) to a temperature within the range of about 325° C. to about 550° C. for a period of about 1 minute to about 15 minutes (longer time periods will work also).

The method of the present invention is not limited to a particular sputtering technique. In addition to the sputtering techniques described above, it is possible to use an externally-generated plasma (typically generated by microwave) which is supplied to the film deposition chamber, or to use a hallow cathode technique of the kind known in the art. However, we have found that when the feature size is small (less than about 0.5 $\mu$m) and the aspect ratio is high (about 2:1 or higher), it is advantageous to use collimated, long-throw, or high density plasma sputter deposition in the apparatus which is described in detail herein.

Typical process parameters for high density plasma sputter deposition, collimated sputter deposition, and long-throw sputter deposition of the ultra-low resistivity tantalum films are set forth in Table 1, below.

TABLE 1

Typical Process Conditions for Sputter Deposition of Ultra-low Resistivity Tantalum Films in ENDURA ® Process Chamber

| Process Parameter | High Density Plasma | Collimated | Long-Throw (Gamma) |
|---|---|---|---|
| Process Chamber Pressure (mT) | 10–40 | 3–5 | 1–3 |
| DC Power to Target (kW) | 1 | 4 | 4 |
| RF Power to Coil (kW) | 1.5 | None | None |
| Bias Power (W) | 350 | None | None |

An example of a high density plasma sputtering method is provided by S. M. Rossnagel and J. Hopwood in their papers "Metal ion deposition from ionized magnetron sputtering discharge", *J. Vac. Sci. Technol. B,* Vol. 12, No. 1 (January/February 1994) and "Thin, high atomic weight refractory film deposition for diffusion barrier, adhesion layer, and seed layer applications", *J. Vac. Sci. Technol. B,* Vol. 14, No. 3 (May/June 1996)

The technique for long throw sputtering is described by S. M. Rossnagel and J. Hopwood in their paper entitled "Thin, high atomic weight refractory film deposition for diffusion barrier, adhesion layer, and seed layer applications", *J. Vac. Sci. Technol.,* B 14(3), May/June 1996. The method uses conventional, non-collimated magnetron sputtering at low pressures, with improved directionality of the depositing atoms. The improved directionality is achieved by increasing the distance between the workpiece surface (the throw), such that the distance between the target and the substrate is equal to or greater than the diameter of the substrate, and by reducing the argon pressure during sputtering. For a film deposited with commercial cathodes (Applied Materials Endura® class; circular planar cathode with a diameter of 30 cm) and rotating magnet defined erosion paths, a throw distance of 25 cm is said to be approximately equal to an interposed collimator of aspect ratio near 1.0, to enable the aluminum to reach the bottom and sidewalls of the contact via structure without causing a bridge-over effect of the structure experienced in some sputter deposition configurations. In the present disclosure, use of this long-throw technique with traditional, non-collimated magnetron sputtering at low pressures is sometimes referred to as "gamma sputtering".

A description of collimated sputtering is provided in U.S. Pat. No. 5,330,628 of Demaray et al., issued Jul. 19, 1994, and a method of controlling a collimated sputtering source is described in U.S. Pat. No. 5,478,455 to Actor et al. issued Dec. 26, 1995.

The method of the present invention is easily practiced in view of the present disclosure, and does not require alteration of existing physical vapor deposition (PVD) equipment presently available within the industry. However, when it is desired to lower the substrate temperature below about 325° C. during deposition of the tantalum film, it is necessary to use high density plasma sputtering techniques which provide for ion bombardment of the film surface, to add momentum energy to the depositing film surface. This enables lowering of the substrate surface temperature by as much as about 40%, while providing a reasonable film deposition time period.

The method of the invention results in the production of tantalum films and $Ta_xN_y$ films having ultra-low bulk resistivities and minimal residual film stress. The method of the invention also provides tantalum films which can be more rapidly polished using CMP techniques. The CMP rate of the tantalum films of the present invention is more compatible with the CMP rate of copper, resulting in a reduction of copper dishing.

The above described preferred embodiments are not intended to limit the scope of the present invention, as one skilled in the art can, in view of the present disclosure expand such embodiments to correspond with the subject matter of the invention as claimed below.

We claim:

1. A method of producing a tantalum film in the absence of nitrogen, said film having a resistivity of less than 20 $\mu\Omega$-cm, wherein said film is produced by high density plasma sputter deposition upon a substrate at a temperature ranging from about 195° C. to about 330° C., and wherein a surface of said tantalum film is ion bombarded during said deposition.

2. A method of producing a $Ta_xN_y$ film having a resistivity of less than 25 $\mu\Omega$-cm, wherein x is 1 and y ranges from about 0.05 to about 0.18, wherein said film is produced by sputter deposition upon a substrate at a temperature of less than about 275° C. and wherein said film is subsequently annealed at a temperature ranging from greater than about 275° C.

3. A method of producing a sputtered tantalum film in the absence of nitrogen, said film having a resistivity of less than 20 $\mu\Omega$-cm, said method comprising:

placing a substrate on a temperature-controlled support platen in a physical vapor deposition process chamber; and controlling a temperature of said support platen during sputtering of said tantalum film upon said substrate, wherein said substrate temperature ranges from about 195° C. to about 330° C. during deposition of said sputtered tantalum film, and wherein said sputter deposition is high density plasma sputter deposition, and a surface of said tantalum film is ion bombarded during said deposition 4. A method of producing a sputtered $Ta_xN_y$ film having a resistivity of less than 25 $\mu\Omega$-cm, wherein x is 1 and y ranges from about 0.05 to about 0.18, said method comprising:

placing a substrate on a temperature-controlled support platen in a physical vapor deposition process chamber; and controlling a temperature of said support platen during sputtering of said $Ta_xN_y$ film upon said substrate, wherein said substrate temperature is about 165° C. or higher during deposition of said sputtered $Ta_xN_y$ film, and wherein said sputter deposition is high density plasma sputter deposition, and a surface of said $Ta_xN_y$ film is ion bombarded during said deposition.

* * * * *

UNITED STATES PATENT AND TRADEMARK OFFICE
CERTIFICATE OF CORRECTION

PATENT NO.   : 6,458,255 B2
DATED        : October 1, 2002
INVENTOR(S)  : Chiang et al.

It is certified that error appears in the above-identified patent and that said Letters Patent is hereby corrected as shown below:

<u>Column 4,</u>
Line 32, after "chamber)" please delete "," and insert -- . --.

<u>Column 11,</u>
Line 6, after "1996)" please insert -- . --.

<u>Column 12,</u>
Line 16, after "deposition" please remove ".".
Line 23, after "C" delete "." and please insert -- to about 550º C --.
Line 52, after "deposition" please delete ".".

Signed and Sealed this

Twenty-fifth Day of March, 2003

JAMES E. ROGAN
*Director of the United States Patent and Trademark Office*